US009136459B2

(12) United States Patent
Fujii et al.

(10) Patent No.: US 9,136,459 B2
(45) Date of Patent: *Sep. 15, 2015

(54) PIEZOELECTRIC DEVICE AND METHOD OF MANUFACTURING PIEZOELECTRIC DEVICE

(71) Applicant: FUJIFILM Corporation, Tokyo (JP)

(72) Inventors: Takamichi Fujii, Ashigarakami-gun (JP); Yoshikazu Hishinuma, Santa Clara, CA (US)

(73) Assignee: FUJIFILM Corporation, Tokyo (JP)

( * ) Notice: Subject to any disclaimer, the term of this patent is extended or adjusted under 35 U.S.C. 154(b) by 414 days.

This patent is subject to a terminal disclaimer.

(21) Appl. No.: 13/644,178

(22) Filed: Oct. 3, 2012

(65) Prior Publication Data

US 2013/0099627 A1    Apr. 25, 2013

Related U.S. Application Data

(60) Provisional application No. 61/543,051, filed on Oct. 4, 2011.

(51) Int. Cl.
*H01L 41/047* (2006.01)
*H01L 41/08* (2006.01)
(Continued)

(52) U.S. Cl.
CPC ......... *H01L 41/0805* (2013.01); *B41J 2/14233* (2013.01); *B41J 2/161* (2013.01); *B41J 2/1628* (2013.01); *B41J 2/1642* (2013.01); *B41J 2/1646* (2013.01); *H01L 41/04* (2013.01); *H01L 41/0471* (2013.01); *H01L 41/0477* (2013.01); *H01L 41/0973* (2013.01); *H01L 41/277* (2013.01); *H01L 41/297* (2013.01);
(Continued)

(58) Field of Classification Search
CPC ....... H04R 17/00; G10K 9/122; H03H 9/131; H03H 9/173; H03H 9/174; H03H 3/02
USPC ............................. 310/324, 363–366; 347/68
See application file for complete search history.

(56) References Cited

U.S. PATENT DOCUMENTS 6,142,615 A   11/2000  Qiu et al.
7,265,483 B2 *  9/2007  Takeda et al. ................. 310/364
(Continued)

FOREIGN PATENT DOCUMENTS

JP   8-116103 A   5/1996
JP   9-181368 A   7/1997
(Continued)

OTHER PUBLICATIONS

U.S. Office Action dated Dec. 24, 2013 for U.S. Appl. No. 13/644,239.
(Continued)

*Primary Examiner* — Thomas Dougherty
(74) *Attorney, Agent, or Firm* — Birch, Stewart, Kolasch & Birch, LLP

(57) ABSTRACT

A piezoelectric device includes: a substrate; a first electrode which is layered over the substrate; a first piezoelectric film which is layered over the first electrode; a metal oxide film which is layered over the first piezoelectric film; a metal film which is layered over the metal oxide film; a second piezoelectric film which is layered over the metal film; and a second electrode which is layered over the second piezoelectric film.

15 Claims, 12 Drawing Sheets

44: PNZT FILM (2.0 μm)
40: Ir-O FILM AND Ir FILM (75 nm)
34: PNZT FILM (2.0 μm)
32: Ir FILM AND Ti FILM
30: Si SUBSTRATE

(51) Int. Cl.

| | | |
|---|---|---|
| *H01L 41/04* | (2006.01) | |
| *H01L 41/277* | (2013.01) | |
| *B41J 2/14* | (2006.01) | |
| *B41J 2/16* | (2006.01) | |
| *H01L 41/09* | (2006.01) | |
| *H01L 41/297* | (2013.01) | |
| *H01L 41/316* | (2013.01) | |

(52) U.S. Cl.
CPC ..... *H01L41/316* (2013.01); *B41J 2002/14258* (2013.01); *B41J 2202/03* (2013.01)

(56) References Cited

U.S. PATENT DOCUMENTS

| | | | |
|---|---|---|---|
| 8,864,288 B2* | 10/2014 | Fujii et al. | 347/68 |
| 2002/0185669 A1* | 12/2002 | Minamikawa | 257/295 |
| 2003/0141786 A1 | 7/2003 | Sakai | |
| 2004/0232805 A1 | 11/2004 | Ebigase et al. | |
| 2004/0232806 A1 | 11/2004 | Ebigase et al. | |
| 2005/0046312 A1 | 3/2005 | Miyoshi | |
| 2005/0082615 A1* | 4/2005 | Minamikawa | 257/347 |
| 2006/0214542 A1* | 9/2006 | Iwashita et al. | 310/364 |
| 2008/0136293 A1 | 6/2008 | Mochizuki et al. | |
| 2009/0026887 A1 | 1/2009 | Fujii et al. | |
| 2009/0066188 A1 | 3/2009 | Naono et al. | |
| 2011/0101828 A1* | 5/2011 | Noda et al. | 310/348 |
| 2012/0147100 A1* | 6/2012 | Nawano et al. | 347/71 |
| 2012/0206019 A1* | 8/2012 | Noda et al. | 310/346 |

FOREIGN PATENT DOCUMENTS

| | | | | |
|---|---|---|---|---|
| JP | 11129478 A | | 5/1999 | |
| JP | 2001-77438 A | | 3/2001 | |
| JP | 2003298134 A | | 10/2003 | |
| JP | 2004 042329 A | * | 2/2004 | .............. B41J 2/045 |
| JP | 2004235553 A | | 6/2004 | |
| JP | 2004221550 A | | 8/2004 | |
| JP | 2004 260024 A | * | 9/2004 | ........... H01L 21/316 |
| JP | 2007059525 A | | 3/2007 | |
| JP | 2009064994 A | | 3/2009 | |
| JP | 2009-139338 A | | 6/2009 | |

OTHER PUBLICATIONS

Japanese Office Action issued in Japanese Application No. 2011-239245 on Mar. 13, 2015.
Japanese Office Action issued in Japanese Appiication No. 2011-239246 on Mar. 13, 2015.
Extended European Search Report for European Application No. 12186954.9 dated Jul. 26, 2013.

* cited by examiner

FIG.7

| | THICKNESS OF INTERMEDIATE LAYER | PEELING OF UPPER PIEZOELECTRIC BODY | STRESS × THICKNESS |
|---|---|---|---|
| PRACTICAL EXAMPLE A | 50nm | NONE | 25N/m² |
| PRACTICAL EXAMPLE B | 70nm | NONE | 35N/m² |
| PRACTICAL EXAMPLE C | 120nm | NONE | 60N/m² |
| PRACTICAL EXAMPLE D | 150nm | NONE | 75N/m² |
| PRACTICAL EXAMPLE E | 200nm | PARTLY PEELED | 100N/m² |
| COMPARATIVE EXAMPLE | 250nm | PEELED | 125N/m² |

|  | METHOD 1 | METHOD 2 | METHOD 3 |
|---|---|---|---|
| UPPER ELECTRODE | -20V | -40V | GROUNDED |
| INTERMEDIATE ELECTRODE | GROUNDED | -20V | +20V |
| LOWER ELECTRODE | +20V | GROUNDED | +40V |

|  | DRIVE | | |
|---|---|---|---|
|  | FIRST LAYER ONLY | SECOND LAYER ONLY | BOTH LAYERS |
| UPPER ELECTRODE | NONE | -9V | -9V |
| INTERMEDIATE ELECTRODE | GROUNDED | GROUNDED | GROUNDED |
| LOWER ELECTRODE | +9V | NONE | +9V |
| AMOUNT OF DISPLACEMENT | 55.5nm | 56.5nm | 95.5nm |

# PIEZOELECTRIC DEVICE AND METHOD OF MANUFACTURING PIEZOELECTRIC DEVICE

BACKGROUND OF THE INVENTION

1. Field of the Invention

The present invention relates to a piezoelectric device and a method of manufacturing the piezoelectric device, and more particularly to a piezoelectric device constituted of piezoelectric films which can be utilized for a variety of purposes such as an actuator, a sensor, a power generating device, and the like, and a manufacturing technique of the same.

2. Description of the Related Art

Japanese Patent Application Publication No. 2009-139338 discloses a structure in which films of piezoelectric material are layered for use of a pressure sensor. The pressure sensor has a laminated structure of electrode layers and the piezoelectric films alternately arranged on a substrate, thereby forming a piezoelectric film laminated body constituted of two or more of piezoelectric films. The electrodes are composed of material such as platinum (Pt), aluminum (Al), molybdenum (Mo), titanium nitride (TiN), ruthenium (Ru), or the like (paragraph 0034 in JP-2009-139338), and each piezoelectric film is formed by a sputtering method (paragraph 0077 in JP-2009-139338).

Japanese Patent Application Publication No. 08-116103 discloses a piezoelectric actuator of a bimorph structure in which electrodes are composed of platinum or palladium. The piezoelectric actuator has a laminated structure in which a first film of piezoelectric material (lead zirconate titanate (PZT)) is layered on a platinum electrode functioning as an external electrode, another platinum electrode functioning as an internal electrode is layered on the first PZT film, and a second PZT film and an external electrode of platinum are layered thereon (paragraph 0018 and FIG. 3 in JP-08-116103).

Japanese Patent Application Publication No. 09-181368 discloses an actuator device having a laminated structure which is manufactured by alternately layering piezoelectric bodies and conductive bodies by means of a film formation technique such as a sputtering method or the like, and also discloses a wiring method of the same. In Japanese Patent Application Publication No. 09-181368, general materials are described with regard to the material of the piezoelectric bodies and the material of the electrodes (platinum, aluminum, gold or silver).

SUMMARY OF THE INVENTION

As described above, there have been known the laminated structures in which the piezoelectric films are layered by the sputtering method, and the electrodes and the piezoelectric films are alternately formed in layers. However, if piezoelectric films are layered while using the general electrode materials and piezoelectric materials in accordance with the related art, there have been problems that the electrodes peel off and the piezoelectric films also peel off, and it has been actually difficult to form the above-described laminated structure constituted of the piezoelectric films.

For example, in the case where the platinum or palladium electrode is arranged as the intermediate layer (the internal electrode), as in JP-08-116103, it is likely that the piezoelectric film peels or cracks, at a time of forming the piezoelectric film.

As the other specific examples, in a formation of the piezoelectric film by means of a vapor phase epitaxy in which a substrate temperature is set to not lower than 350° C. and not higher than 650° C. (the substrate temperature is a temperature at which the piezoelectric material is crystal grown directly in the vapor phase epitaxy), if an electrode of Pt, iridium (Ir) or the like is formed under a normal condition after forming the piezoelectric film, and another piezoelectric film is thereafter formed on the electrode, there has been a problem that the electrode peels off and the piezoelectric film also peels off.

Further, even in the case that the peeling or the like mentioned above is not generated, an adhesion of the film after the film formation is not good, and the durability as the device has a problem. Even if an adhesion layer of titanium (Ti) or the like is used in order to improve the adhesion, there has been a problem that the piezoelectric film actually peels off.

The present invention has been contrived in view of these circumstances, an object thereof being to provide a piezoelectric device which enhances the adhesion of films in a laminated body formed by layering a plurality of piezoelectric films so as to prevent peeling, and is high in durability and reliability, and to provide a manufacturing method which can manufacture the piezoelectric device mentioned above.

In order to attain the aforementioned object, the present invention is directed to a piezoelectric device, comprising: a substrate; a first electrode which is layered over the substrate; a first piezoelectric film which is layered over the first electrode; a metal oxide film which is layered over the first piezoelectric film; a metal film which is layered over the metal oxide film; a second piezoelectric film which is layered over the metal film; and a second electrode which is layered over the second piezoelectric film.

According to this aspect of the present invention, the metal oxide film layered over the first piezoelectric film functions as a diffusion block layer, and diffusion of oxygen atoms and the piezoelectric material components from the piezoelectric film to the metal film is suppressed. Accordingly, it is possible to prevent a structure change of the metal film and a reduction of the adhesion caused by the diffusion, and it is possible to obtain the laminated structure of the piezoelectric films having a firm adhesion with the laminated structure (intermediate layer) of the metal oxide film and the metal film therebetween.

Upon interpretation, the expression "A is layered over B" is not limited to a case that A is directly layered on B while A is in contact with B, but can include a case that one or more of other layers is interposed between A and B, and A is layered over B while there is the other layer between A and B.

The structure can be made such that a construction in which the intermediate layer of the metal oxide film and the metal film is layered over the piezoelectric film and another piezoelectric film is layered over the intermediate layer, is repeated, whereby three or more piezoelectric films are layered. In this case, the piezoelectric film in the top layer can be interpreted as the "second piezoelectric film", and the piezoelectric film in the second or higher stage can be interpreted as the "second piezoelectric film".

Preferably, a product of a stress and a thickness is less than 100 N/m in an intermediate layer constituted of the metal oxide film and the metal film between the first piezoelectric film and the second piezoelectric film.

According to this aspect of the present invention, the peeling caused by the stress due to the difference of the thermal expansion coefficients between the piezoelectric film and the intermediate layer is suppressed.

Preferably, the thickness of the intermediate layer is not smaller than 50 nm and smaller than 250 nm.

In the light of the diffusion block characteristics by the intermediate layer, and the suppression of the peeling caused by the stress due to the difference of the thermal expansion coefficients between the piezoelectric film and the intermediate layer, the structure in which the thickness of the intermediate layer is set to the range of not smaller than 50 nm and smaller than 250 nm is preferable.

Preferably, each of the first piezoelectric film and the second piezoelectric film is formed by means of a vapor phase epitaxy method.

The piezoelectric films having desired piezoelectric performances can be obtained by using the vapor phase epitaxy method which is represented by the sputtering method. Further, the piezoelectric films can be readily grown on the metal film, and it is possible to achieve a good film formation.

Preferably, the vapor phase epitaxy method is a sputtering method of crystallizing by implementing a heat film formation.

According to this aspect of the present invention, since the metal oxide film functions as the diffusion block layer, it is possible to prevent the material component or the like from the piezoelectric film in the lower layer from diffusing into the metal film at a time of the heat film formation, and it is possible to obtain the laminated structure of the piezoelectric films having a high adhesion.

Preferably, the metal oxide film includes an oxide of a metal of platinum group.

It is possible that the metal oxide film is of any oxide of any metal of the platinum group such as ruthenium (Ru), rhodium (Rh), palladium (Pd), osmium (Os), iridium (Ir), and platinum (Pt).

It is also preferable that the metal oxide film includes an oxide of a metal of titanium group.

It is possible that the metal oxide film is an oxide of titanium (Ti) such as TiO, $TiO_2$, and the like, or any oxide of any metal of the titanium group such as Ti, zirconium (Zr) and hafnium (Hf).

Preferably, the metal film includes a metal of platinum group.

The metal film can be composed of various metals, and the metal film is preferably composed of the metals of the platinum group such as Ru, Os, Rh, Ir, Pd, Pt and the like. In this case, the first electrode and the second electrode can be composed of the metals of the platinum group. Further, the first electrode and the second electrode can be composed of the metals of the copper group, copper (Cu), silver (Ag) and gold (Au).

Preferably, each of the first piezoelectric film and the second piezoelectric film is composed of a perovskite type oxide.

The piezoelectric device of the perovskite type oxide has good piezoelectric characteristics, and can be utilized for a variety of purposes such as an actuator, a sensor, a power generating device, and the like.

Preferably, in each of the first piezoelectric film and the second piezoelectric film, the perovskite type oxide has a crystal preferred orientation of (100) or (001).

In order to attain the aforementioned object, the present invention is also directed to a manufacturing method of a piezoelectric device, the method comprising: a first electrode formation step of layering a first electrode over a substrate; a first piezoelectric film formation step of layering a first piezoelectric film over the first electrode; a metal oxide film formation step of layering a metal oxide film over the first piezoelectric film; a metal film formation step of layering a metal film over the metal oxide film; a second piezoelectric film formation step of layering a second piezoelectric film over the metal film; and a second electrode formation step of layering a second electrode over the second piezoelectric film.

According to this aspect of the present invention, it is possible to prevent a structure change of the metal film and a reduction of the adhesion caused by the diffusion, and it is possible to obtain the laminated structure of the piezoelectric films having a firm adhesion.

Preferably, each of the first piezoelectric film formation step and the second piezoelectric film formation step includes a vapor phase epitaxy method.

According to the present invention, it is possible to prevent the peeling of the films and the reduction of the adhesion which come to the problem in the laminated bodies in the related art, and it is possible to form a laminated body of a plurality of piezoelectric films. Thus, it is possible to obtain a piezoelectric device which is high in durability and reliability.

BRIEF DESCRIPTION OF THE DRAWINGS

The nature of this invention, as well as other objects and advantages thereof, will be explained in the following with reference to the accompanying drawings, in which like reference characters designate the same or similar parts throughout the figures and wherein:

FIG. 7 is a table showing results of experiments about a relationship between a thickness of an intermediate layer and a peeling;

DETAILED DESCRIPTION OF THE PREFERRED EMBODIMENTS

Embodiment

Figure 1:
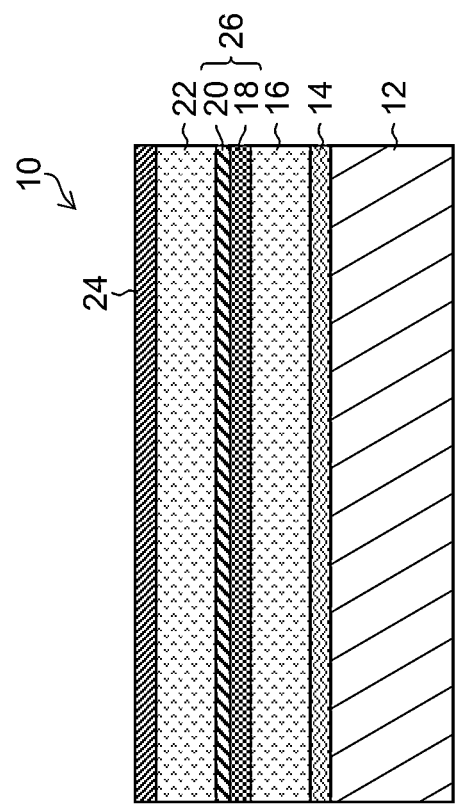
FIG. 1 is a cross sectional view showing a structure of a piezoelectric device according to an embodiment of the present invention.

FIG. 1 is a cross sectional view showing a structure of a piezoelectric device according to an embodiment of the present invention. The piezoelectric device 10 shown in FIG. 1 has a laminated structure in which a first electrode 14 is formed on a substrate 12 functioning as a support body, a first piezoelectric film 16 is formed thereon, and a metal oxide film 18, a metal film 20, a second piezoelectric film 22 and a second electrode 24 are formed in layers further thereon in this order.

Here, in FIG. 1 and the other drawings, film thicknesses of the layers and a rate thereof are drawn while being appropriately changed for convenience of explanation, and are not necessarily shown by reflecting the actual film thicknesses and rate. Further, in the present specification, when describing the laminated structure, a direction of being away from the surface of the substrate 12 in a thickness direction of the substrate 12 is expressed as the "upper" direction. In FIG. 1, since the piezoelectric device 10 is structured such that the layers 14 to 24 are sequentially layered on the upper surface of the substrate 12 in a state of retaining the substrate 12 horizontally, the arrangement of the layers coincides with an upper and lower relationship at a time of setting the direction of the gravitational force (the lower direction in FIG. 1) to the downward direction. In this case, an attitude of the substrate 12 can be inclined or inverted. In order to express the upper and lower relationship of the laminated structure without confusion even in the case that the laminating direction of the laminated structure which depends on the attitude of the substrate 12 does not necessarily coincide with the upper and lower direction on the basis of the direction of the gravitational force, a direction of being away from the surface of the substrate 12 in the thickness direction of the substrate 12 is expressed as the upper direction. For example, even in the case that the upper and lower sides in FIG. 1 are inverted, it is described by an expression that the first electrode 14 is formed over the upper surface of substrate 12, and the first piezoelectric film 16 is layered over the upper surface of the first electrode 14.

The piezoelectric device 10 shown in FIG. 1 has the laminated structure in which the two piezoelectric films (the first piezoelectric film 16 and the second piezoelectric film 22) are layered with an intermediate layer 26 therebetween. The intermediate layer 26 has a laminated structure of the metal oxide film 18 and the metal film 20. The first electrode 14 is arranged on the lower side of the two piezoelectric films 16 and 22, and the second electrode 24 is arranged on the top surface.

Although the two piezoelectric films 16 and 22 are hereby exemplified, it is also possible that three or more piezoelectric films are layered while interposing intermediate layers (each corresponding to the intermediate layer 26 in FIG. 1), in implementation of the present invention. In this case, the intermediate layer (corresponding to the intermediate layer 26 in FIG. 1) is formed in place of the second electrode 24 in FIG. 1, thereby forming a laminated structure in which the piezoelectric films and the intermediate layers are alternately layered. On the assumption that a number of stages (a laminating number) at which the piezoelectric films are layered is n (where n is an integer larger than 1), the intermediate layers are formed at (n−1) layers. Further, the second electrode such as the second electrode 24 in FIG. 1 is formed on the piezoelectric film of the top layer (the n-th layer).

A material of the substrate 12 is not particularly limited, and can employ various materials, for example, silicon (Si), glass, ceramics and the like.

The first electrode 14 can be composed of various materials such as platinum (Pt), aluminum (Al), molybdenum (Mo), titanium nitride (TiN), ruthenium (Ru), gold (Au), silver (Ag), and the like. It is preferable that the first electrode 14 includes a metal of the platinum group (Ru, Rh, Pd, Os, Ir, Pt). It is also preferable that the first electrode 14 has an adhesion layer of Ti or TiW (titanium-tungsten), in order to enhance the adhesion with the substrate 12. It is further preferable that the first electrode 14 has a laminated structure of the adhesion layer arranged on the substrate 12 and the layer of metal of the platinum group arranged on the adhesion layer.

The second electrode 24 can be composed of various materials similarly to the first electrode 14. It is preferable that the second electrode 24 includes a metal of the platinum group or the copper group (Cu, Ag, Au). It is further preferable that the second electrode 24 has a laminated structure of an adhesion layer of Ti or TiW and a layer of metal of the platinum group arranged on the adhesion layer. The first electrode 14 and the second electrode 24 can be composed of the same material, or can be composed of different materials. For example, it is possible that the first electrode 14 has the laminated structure of TiW/Pt and the second electrode 24 has the laminated structure of TiW/Au.

The metal oxide film 18 functions as a diffusion block layer that prevents diffusion of oxygen atoms or piezoelectric material components from the piezoelectric film 16 of the first layer. The metal oxide film 18 can be a conductive body or an insulating body. It is preferable that the metal oxide film 18 includes an oxide of a metal of the platinum group or the titanium group (Ti, Zr, Hf). For example, the metal oxide film 18 can be composed of an oxide of Ir (which is referred to as "$IrO_x$" or "Ir—O"), or an oxide of Ti (e.g., TiO, $TiO_2$, or the like).

The metal film 20 formed over the metal oxide film 18 plays a part which is useful for forming the piezoelectric film 22 of the second layer by means of the vapor phase epitaxy (the sputtering method, or the like). The piezoelectric film used in the present embodiment is hard to be grown on the oxide, and is easy to be grown on the metal. Accordingly, it is preferable that the metal film 20 is arranged on the metal oxide film 18, and the piezoelectric film (the second piezoelectric film 22) is formed on the metal film 20. The material of the metal film 20 is not particularly limited, and the metal film 20 preferably includes a metal of the platinum group, for example, Ir, Pr and the like.

The intermediate layer 26 having the laminated structure of the metal oxide film 18 and the metal film 20 can be used as an intermediate electrode. In the case where the intermediate layer 26 is used as the intermediate electrode, it is preferable that the metal oxide film 18 is composed of a conductive material. In the case where the intermediate layer 26 is not used as any electrode, the metal oxide film 18 can be an insulating material.

The structure of the intermediate layer 26 can be either amorphous or crystal. A surface roughness and a structure of the film (a columnar structure, a granular structure, or the like) of the intermediate layer 26 are not particularly limited. Further, orientations and a degree of preferred orientations of the crystals of the intermediate layer 26 are not limited. It is preferable that the intermediate layer 26 includes an oxide; however, it can include nitrogen.

Each of the first piezoelectric film 16 and the second piezoelectric film 22 is formed by crystallizing by rising a substrate temperature while the film formation by means of the vapor phase epitaxy method. The material of the first piezoelectric film 16 and the second piezoelectric film 22 is not particularly limited as long as it is the oxide piezoelectric body. The first piezoelectric film 16 and the second piezoelectric film 22 can be composed of the same material or can be composed of different materials.

Inquiry into Cause of Peeling

The present inventors have inquired into the cause by which the peeling of the electrodes and the piezoelectric films is generated in the case of manufacturing the laminated body in which the piezoelectric films and the electrodes are alternately layered in the related art, and have found that oxygen atoms and the piezoelectric material component (for example, lead (Pb) or the like in the case of the PZT material) are diffused into the electrode from the piezoelectric material, at the film formation temperature at a time of forming the piezoelectric body, thereby causing a structure change of the electrode material and a reduction of the adhesion so as to peel off. Then, the present inventors have found that, in order to prevent the peeling of the electrodes and the piezoelectric films to obtain a device having a high durability, it is useful to obstruct (block) the diffusion of the component of the piezoelectric material in the piezoelectric film formed on the substrate into the electrode layer, and it is particularly important to block the diffusion of oxygen atoms.

On the basis of the knowledge mentioned above, in the embodiment of the present invention, after forming the piezoelectric film of the first layer (the first piezoelectric film 16), the metal oxide film 18 functioning as the diffusion block layer is formed over the piezoelectric film 16 of the first layer, and the diffusion from the piezoelectric film of the first layer (the first piezoelectric film 16) is blocked by the metal oxide film 18. Further, the metal film 20 is formed over the metal oxide film 18, and the piezoelectric film of the second layer (the second piezoelectric film 22) is formed over the metal film 20. In other words, the intermediate layer having the laminated structure of the metal oxide film and the metal film is interposed between the piezoelectric film of the first layer and the piezoelectric film of the second layer, and the piezoelectric films are arranged in layers with the intermediate layer therebetween. By repeating the steps mentioned above, it is possible to layer the piezoelectric films while ensuring the firm adhesion.

First Practical Example

FIGS. 2A to 2G are views showing a manufacturing process of a piezoelectric device according to a first practical example of the present invention.

Figure 2A:
FIGS. 2A to 2G are explanatory views showing a manufacturing process of a piezoelectric device in a first practical example of the present invention.
Figure 2B:
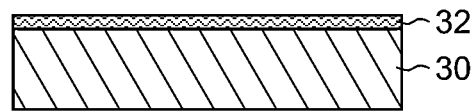

Step 1: First of all, a silicon (Si) substrate 30 was prepared (FIG. 2A). Here, the example using a bulk silicon substrate (a Si wafer) is shown; however, a silicon-on-insulator (SOI) substrate also can be used.

Step 2: A film of TiW was formed at a film thickness of 20 nm on a surface (the upper surface in FIG. 2B) of the Si substrate 30 by means of the sputtering method, and a film of Ir was formed at a film thickness of 150 nm thereon. A lower electrode 32 was thereby formed to have a laminated structure of the TiW film of 20 nm and the Ir film of 150 nm.

Figure 2C:
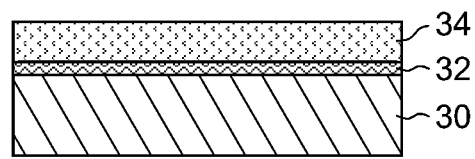

Step 3: Thereafter, a film 34 of lead zirconate titanate doped with niobium (Nb) (hereinafter referred to as "PNZT" or also to simply as "PZT") was formed at a film thickness of 2 μm on the lower electrode 32 at a film formation temperature of 500° C. by means of the sputtering method (FIG. 2C). In the formation of the PZT film 34, a radio frequency (RF) magnetron sputter apparatus was used, a film formation gas was a mixed gas of Ar of 97.5 vol. % and $O_2$ of 2.5 vol. %, a target was a material having composition of $Pb_{1.3}((Zr_{0.52}Ti_{0.48})_{0.88}Nb_{0.12})O_3$ and a film formation pressure was 2.2 mTorr.

Figure 2D:
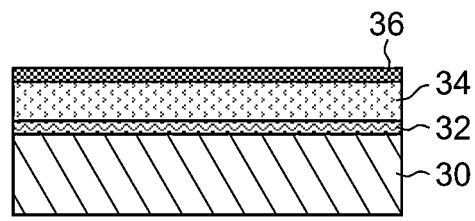

Step 4: An Ir—O film 36 was formed at a film thickness of 50 nm on the PZT film 34 at a film formation temperature of 350° C. by means of the sputtering method (FIG. 2D).

Figure 2E:
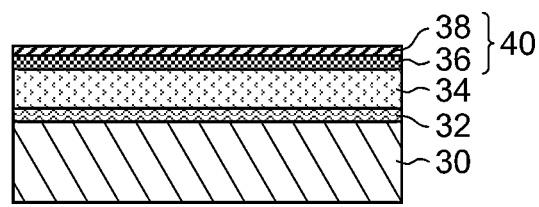

Step 5: An Ir film 38 was formed at a film thickness of 20 nm on the Ir—O film 36 (FIG. 2E). An intermediate layer or electrode 40 was thereby formed to have a laminated structure of the Ir—O film 36 and the Ir film 38.

The formation of the Ir—O film 36 was carried out by a mixed gas of 50% Ar and 50% $O_2$ at a pressure of 0.5 Pa by means of the reactive sputtering method using an Ir target. Further, the Ir film 38 was obtained by using only the Ar gas as the film formation gas after the formation of the Ir—O film 36.

The Ir—O film 36 functions as a block to prevent the diffusion of lead and oxygen from the PZT film 34 of the first layer. Further, the Ir film 38 formed on the Ir—O film 36 was inserted for lowering the electric resistance of the intermediate electrode, and also for carrying out a growth of a PZT film of the next layer under the same conditions as the growth of the initial (first) PZT film. The film formation temperature of the Ir—O film 36 and the Ir film 38 was 350° C. in the present example for improving the adhesion and lowering the electric resistance rate; however, it can be a room temperature or can be a higher temperature. The same results were obtained by actual experimentations while changing the temperature.

Figure 2F:
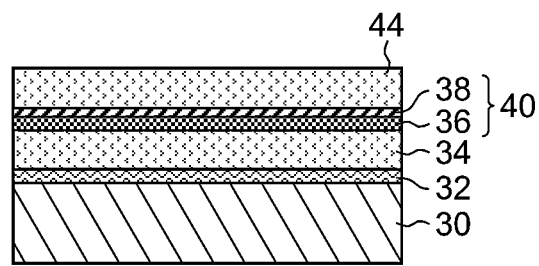

Step 6: After forming the intermediate electrode 40, a PZT film 44 of the second layer was formed thereon (FIG. 2F). The film formation conditions were the same conditions as the PZT film 34 of the first layer, and the film thickness of the PZT film 44 of the second layer was about 2 μm.

Figure 3:
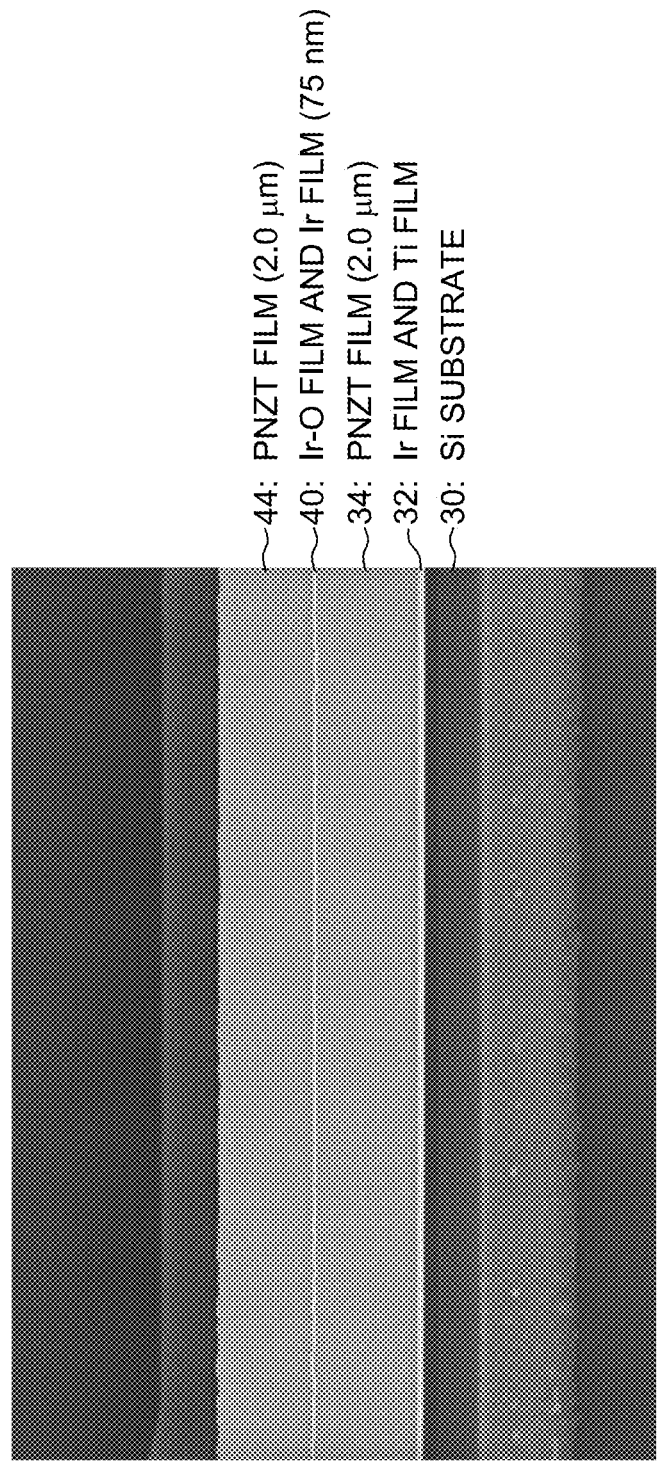
FIG. 3 is a scanning electron microscopy (SEM) image showing a structure of a laminated body of piezoelectric films produced in the first practical example.

For reference, FIG. 3 shows a scanning electron microscopy (SEM) image of the laminated structure of the films in the state in which the PZT film 44 of the second layer was formed by Step 6. The laminated body shown in FIG. 3 was obtained by Steps 1 to 6. As shown in FIG. 3, the two PZT films 34 and 44 were layered with firm adhesion with the intermediate electrode 40 therebetween, and a good laminated body having no peeling was obtained.

Figure 2G:
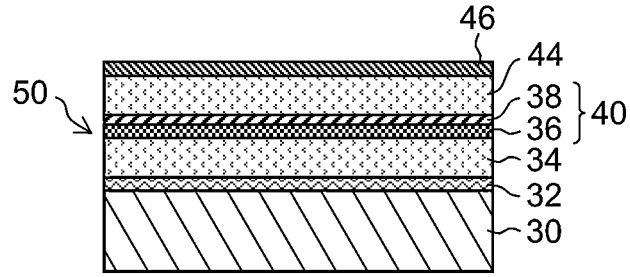

Step 7: Thereafter, an upper electrode 46 was formed on the PZT film 44 of the second layer (FIG. 2G). The upper electrode 46 was structured in the same manner as the lower electrode 32 such that a TiW film was formed at a film thickness of 20 nm by means of the sputtering method, and an Ir film was layered thereon so as to be formed at a film thickness of 150 nm. The upper electrode 46 was thereby formed to have a laminated structure of the TiW film of 20 nm and the Ir film of 150 nm. Thus, a piezoelectric device 50 having the laminated structure as shown in FIG. 2G was obtained. Here, a back side (a lower surface side) of the Si substrate 30 in FIG. 2G can be partly removed by means of etching or the like.

Correspondence of Structure in FIG. 2G to Structure in FIG. 1

The Si substrate 30 in FIG. 2G corresponds to the substrate 12 in FIG. 1. The lower electrode 32 in FIG. 2G corresponds to the first electrode 14 in FIG. 1. The PZT film 34 in FIG. 2G corresponds to the first piezoelectric film 16 in FIG. 1, and the PZT film 44 in FIG. 2G corresponds to the second piezoelectric film 22 in FIG. 1. The Ir—O film 36 in FIG. 2G corresponds to the metal oxide film 18 in FIG. 1, and the Ir film 38 in FIG. 2G corresponds to the metal film 20 in FIG. 1. The upper electrode 46 in FIG. 2G corresponds to the second electrode 24 in FIG. 1.

Hysteresis Characteristics

Figure 4:
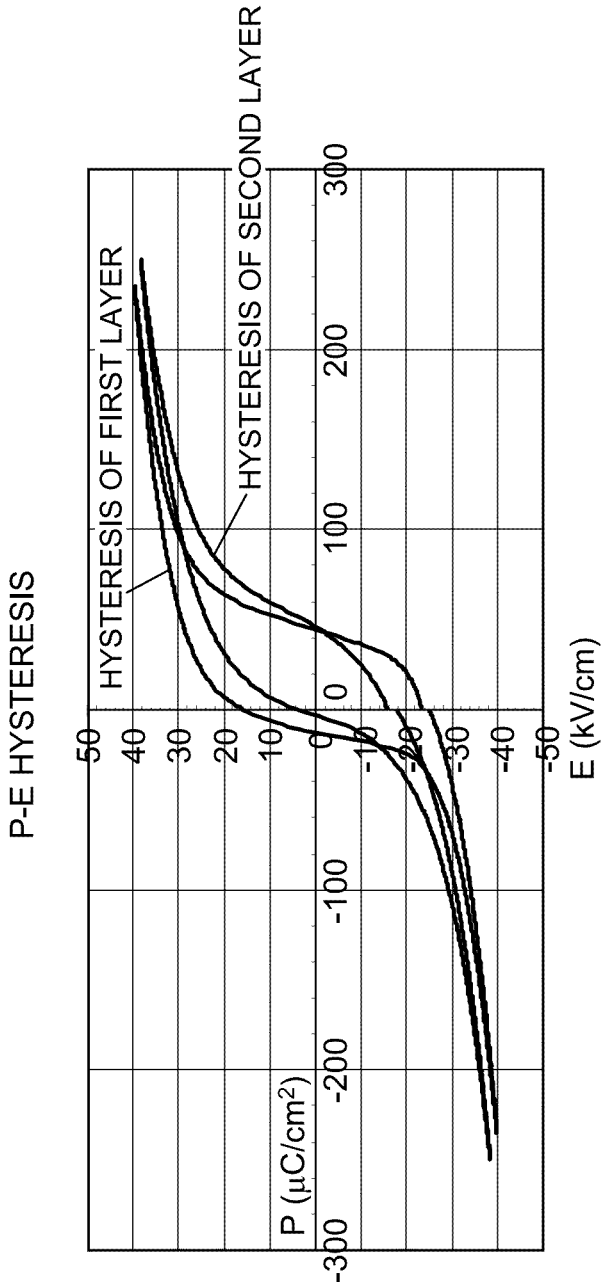
FIG. 4 is a view showing P-E hysteresis characteristics of the piezoelectric films produced in the first practical example.

With regard to the piezoelectric device 50 which was obtained in the first practical example, the characteristics of the piezoelectric bodies between the electrode pairs (between the lower electrode 32 and the intermediate electrode 40, and between the intermediate electrode 40 and the upper electrode 46) were investigated. FIG. 4 shows the hysteresis characteristics of the piezoelectric body of the first layer (the PZT film 34) existing between the lower electrode 32 and the intermediate electrode 40, and the hysteresis characteristics of the piezoelectric body of the second layer (the PZT film 44) existing between the intermediate electrode 40 and the upper electrode 46. The vertical axis in FIG. 4 indicates the electric field, and the horizontal axis indicates the polarization.

As illustrated, the piezoelectric body in each of the layers exhibited the good hysteresis characteristics, and the sufficient piezoelectric performance was obtained. Here, the hysteresis curve of each of the layers was formed as a shape that was shifted to the right-hand side as a whole, and the piezoelectric bodies were previously polarized.

XRD Characteristics

Figure 5:
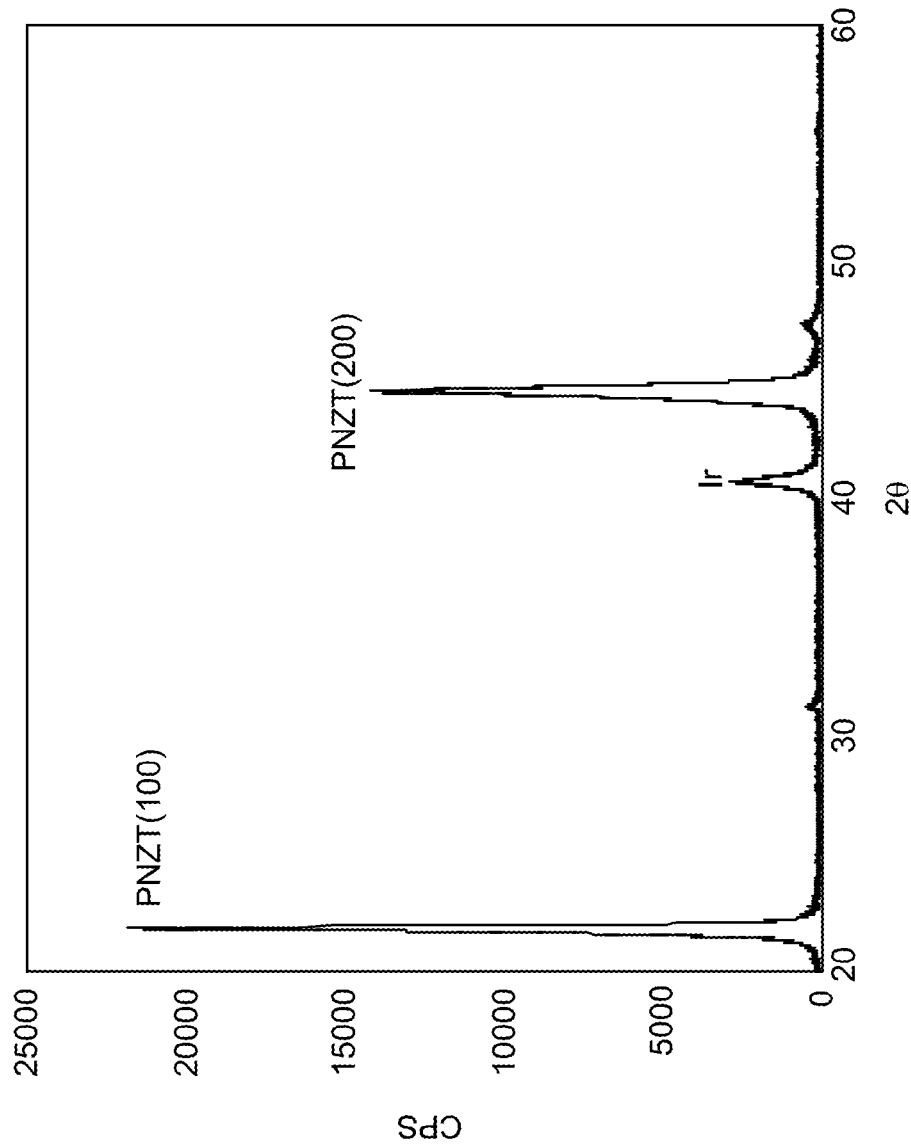
FIG. 5 is a view showing X-ray diffraction (XRD) characteristics of the piezoelectric films produced in the first practical example.

FIG. 5 shows a result of analyzing the laminated structure of the two piezoelectric films (shown in FIG. 3) which was obtained in the first practical example, by means of the X-ray diffraction (XRD). In FIG. 5, the horizontal axis indicates the diffraction angle 2θ, and the vertical axis indicates the diffraction intensity. In the analysis of the crystal structures by means of the X-ray diffraction, the laminated body constituted of the two piezoelectric films was irradiated with the X-ray from the above in a lump. As illustrated, the PNZT films obtained in the present example exhibited the diffraction patterns highly concentrated at the PNZT crystal planes (100) and (200), and were confirmed as the highly oriented piezoelectric films having (100) and (001) as the crystal preferred orientations. It was possible to well form the piezoelectric films having the excellent crystallinity without any heterogeneous phase, in accordance with the method described in the first practical example.

Film Formation Method

As the film formation method of the piezoelectric film, the vapor phase epitaxy method is preferable. It is possible to apply various methods, for example, an ion plating method, a metal organic chemical vapor (MOCVD) deposition method, a pulse laser deposition (PLD) method, and the like in addition to the sputtering method. Further, there can be thought that the other methods (for example, a sol-gel method and the like) than the vapor phase epitaxy method are used.

Piezoelectric Material

The piezoelectric materials which are preferable in the present embodiment include one or more types of perovskite type oxide (P) as expressed by the following general formula:

$$ABO_3, \qquad (P)$$

where A is an A site element and at least one element including Pb; B is a B site element and at least one element selected from the group consisting of Ti, Zr, V, Nb, Ta, Sb, Cr, Mo, W, Mn, Sc, Co, Cu, In, Sn, Ga, Zn, Cd, Fe and Ni; O is oxygen; and the standard mol ratio of the A site element, the B site element and oxygen is 1:1:3, but the mol ratio may deviate from the standard mol ratio within a range that enables a perovskite structure to be obtained.

A perovskite type oxide expressed by the above-described general formula can be: one of lead-containing compounds, such as lead titanate, lead zirconate titanate (PZT), lead zirconate, lead lanthanum titanate, lead lanthanum zirconate titanate, lead magnesium niobate zirconium titanate, nickel niobate lead zirconium titanate, lead zinc niobate zirconium titanate, or the like, or mixed crystal systems of these; or one of non-lead-containing compounds, such as barium titanate, strontium barium titanate, bismuth sodium titanate, bismuth potassium titanate, sodium niobate, potassium niobate, lithium niobate, bismuth ferrite, or the like, or mixed crystal systems of these.

The piezoelectric film according to the present embodiment desirably contains one or more types of perovskite type oxide (PX) as expressed by the following formula:

$$A_a(Zr_x,Ti_y,M_{b-x-y})_bO_c, \qquad (PX)$$

where A is an A site element and at least one element including Pb; M is at least one element selected from the group consisting of V, Nb, Ta and Sb; the relationships $0<x<b$, $0<y<b$, and $0 \leq (b-x-y)$ are satisfied; and $a:b:c=1:1:3$ is standard, but the mol ratio may deviate from the standard mol ratio within a range that enables a perovskite structure to be obtained.

Since the piezoelectric film composed of the perovskite type oxide represented by the general expression (P) or (PX) mentioned above has a high piezoelectric strain constant ($d_{31}$ constant), the piezoelectric actuator that is provided with the piezoelectric film mentioned above becomes excellent in a displacement characteristic. In this case, the piezoelectric constant becomes higher in the piezoelectric film composed of the perovskite type oxide represented by the general expression (PX) than in the piezoelectric film composed of the perovskite type oxide represented by the general expression (P).

Further, the piezoelectric actuator provided with the piezoelectric film composed of the perovskite type oxide represented by the general expression (P) or (PX) has the voltage-displacement characteristics of excellent linearity in a range of the drive voltage. The piezoelectric materials exhibit the piezoelectric characteristics which are good for implementation of the present invention.

Second Practical Example

FIGS. 6A to 6M are views showing a manufacturing process of a piezoelectric device according to a second practical example of the present invention. In FIGS. 6A to 6M, the same or similar elements as those in FIGS. 2A to 2G are denoted with the same reference numerals, and description thereof is omitted.

Steps 1 to 3: Steps 1 to 3 shown in FIGS. 6A to 6C were the same as Steps 1 to 3 in the first practical example described with reference to FIGS. 2A to 2C. A description thereof is omitted here.

Figure 6A:
FIGS. 6A to 6M are explanatory views showing a manufacturing process of a piezoelectric device in a second practical example of the present invention.
Figure 6B:
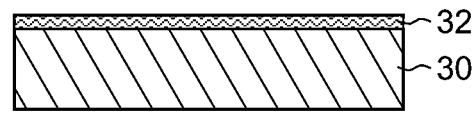
Figure 6C:
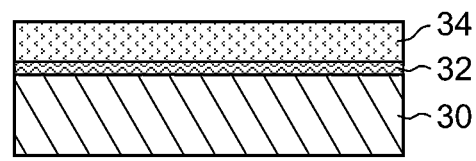
Figure 6D:
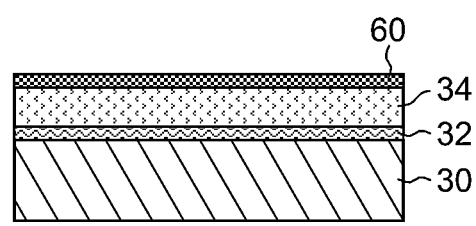

Step 4: As shown in FIG. 6D, a film 60 of TiO$_2$ was formed at 200 nm as an insulating layer on the PZT film 34.

Figure 6E:
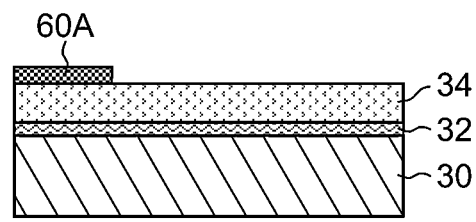

Step 5: The TiO$_2$ insulating layer 60 was patterned in such a manner as to leave a desired region part and remove the other parts (FIG. 6E). The insulating layer that was left by the patterning is denoted with 60A.

Figure 6F:
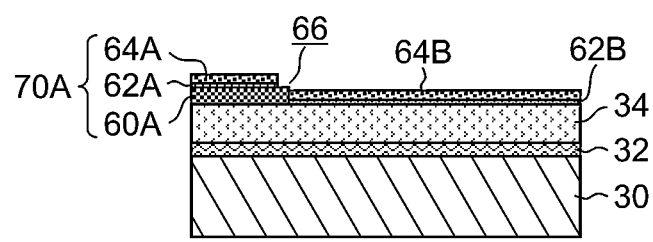

Step 6: Thereafter, Ir—O films 62A and 62B and Ir films 64A and 64B were layered on the PZT film 34 having the insulating layer 60A, to have a total film thickness of 150 nm (FIG. 6F). The laminated structure of the Ir—O film and the Ir film was formed on the insulating layer 60A and on the region of the PZT film 34 over which the insulating layer 60 had been removed. Here, the Ir—O film formed on the insulating layer 60A is denoted with 62A, the Ir film formed on the Ir—O film 62A is denoted with 64A, the Ir—O film formed on the PZT film 34 in the region having no insulating layer 60A is denoted with 62B, and the Ir film formed on the Ir—O film 62B is denoted with 64B.

Since it was necessary that the Ir—O film 62A and the Ir film 64A on the insulating layer 60A were electrically insulated from the Ir—O film 62B and the Ir film 64B on the PZT film 34 in the region having no insulating layer 60A, the Ir—O film 62A and the Ir film 64A on the insulating layer 60A were separated from the Ir—O film 62B and the Ir film 64B on the PZT film 34 in the region having no insulating layer at a distance defined by a predetermined insulating region 66 (FIG. 6F). A method for separating can be a liftoff method or a dry etching method. Further, taking the next step into consideration, since it is advantageous in a point of a yield ratio that heights of the Ir films 64A and 64B are close to each other, a measure for bringing the heights close to each other (i.e., for reducing a vertical interval between the Ir films 64A and 64B) can be appropriately employed.

Figure 6G:
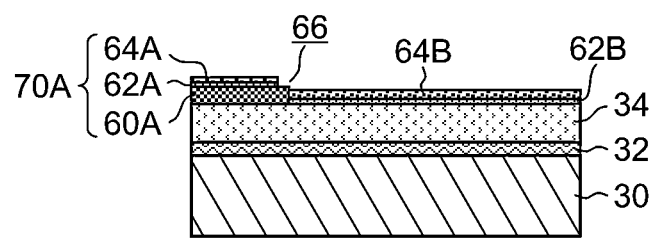

FIG. 6G shows that the Ir film 64A formed on the insulating layer 60A was made thinner, as an example that the heights were brought close to each other. In place of the method or in combination with this, it is also possible to make the Ir film 64B thicker on the PZT film 34 in the region having no insulating layer 60A.

Figure 6H:
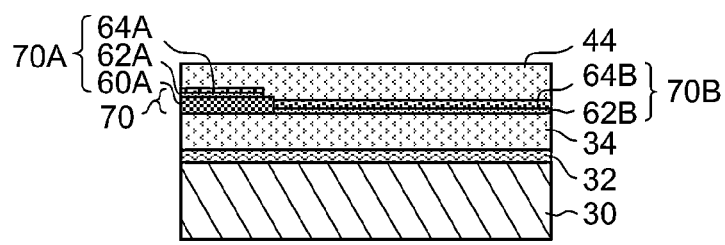
Figure 6I:
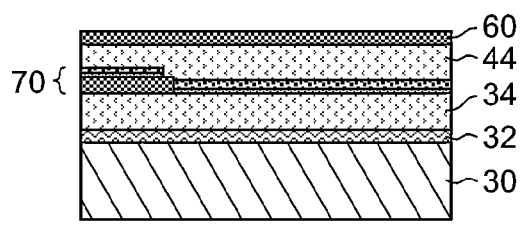

A laminated body 70A of the insulating layer 60A, and the Ir—O film 62A and the Ir film 64A formed thereon shown in FIGS. 6F and 6G functions as an "intermediate layer". Further, an electrode layer 70B shown in FIG. 6H having a laminated structure of the Ir—O film 62B and the Ir film 64B in the region in which the insulating material had been removed is an intermediate layer which functions as the intermediate electrode. In the following description, the electrode layer 70B and the intermediate layer 70A having the insulating layer 60A are collectively described as an intermediate layer 70 as shown in FIG. 6I, for example.

Step 7: As shown in FIG. 6H, the PZT film 44 film of the second layer was formed on the intermediate layer 70. The film formation conditions of the PZT film 44 of the second layer were the same conditions as the PZT film 34 of the first layer.

Step 8: Thereafter, in the same manner as Step 4 described with reference to FIG. 6D, another TiO$_2$ film 60 was formed as the insulating layer on the PZT film 44 (FIG. 6I), and the same steps as Steps 5 to 7 (FIG. 6E to FIG. 6H) were repeated. By repeating the same steps as Steps 4 to 7 once or more, a laminated structure in which the intermediate layers 70 and the piezoelectric films 44 are alternately layered was formed (FIG. 6J).

Figure 6J:
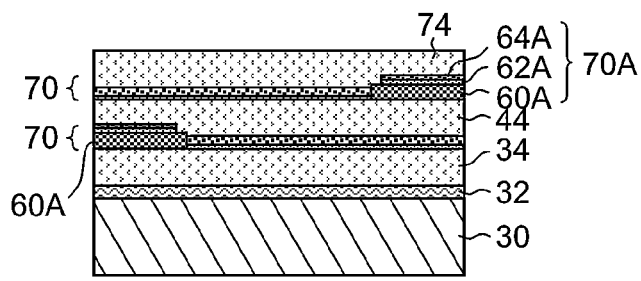

FIG. 6J shows the example in a state where the PZT film 74 of the third layer was formed. It is possible to form four or more PZT films are layered.

The patterns of the insulating layers 60A in the intermediate layers 70 were formed as alternately changing the positions such that the take-out directions of the electrodes (the positions of the end surfaces through which the electrodes are taken out) in the electrode layers 70B were alternately changed right and left in the respective stages.

Figure 6K:
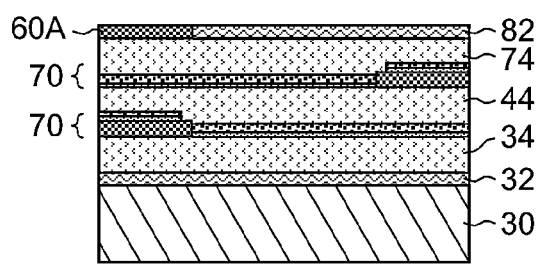

Step 9: Thereafter, the TiO$_2$ film functioning as the insulating layer 60 was formed on the PZT film 74 of the top layer (the third layer in this case), the formed TiO$_2$ film was patterned so as to leave the insulating layer 60A at a desired position, and an upper electrode 82 was thereafter formed (FIG. 6K). Thereby, a laminated body as shown in FIG. 6K was obtained.

Figure 6L:
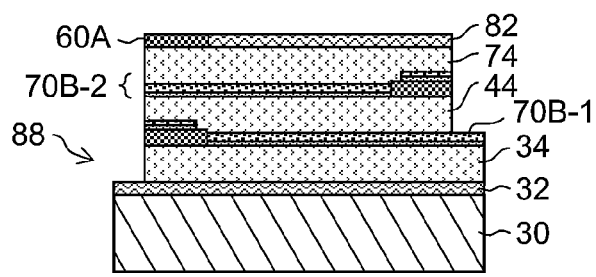

Step 10: With respect to the laminated body in FIG. 6K, side wall portions were cut by means of a dry etching so as to form a laminated body 88 of a desired shape (FIG. 6L), and thereby electrode layers (intermediate electrodes) 70B-1 and 70B-2 of the intermediate layers 70 were exposed to the surfaces of the side walls. In FIG. 6L, the electrode layer formed between the PZT film 34 of the first layer and the PZT film 44 of the second layer was denoted with 70B-1, and the electrode layer formed between the PZT film 44 of the second layer and the PZT film 74 of the third layer was denoted with 70B-2.

Figure 6M:
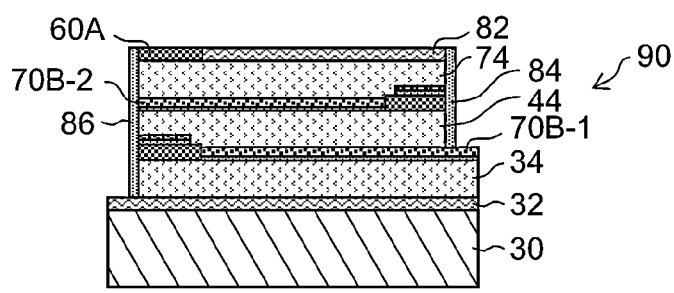

Step 11: Thereafter, side wall electrodes 84 and 86 were formed in the side surface portions of the laminated body 88 in FIG. 6L by means of a sputtering method (FIG. 6M). Here, although FIG. 6M shows that the side walls were vertical to the substrate plane; since the laminated body was actually cut by means of the dry etching in Step 10 to have a tapered shape to become smaller toward the top and have inclined side walls, it was possible to readily form the side wall electrodes 84 and 86 in the inclined side wall surfaces.

The side wall electrode 84 formed in the side wall surface in the right-hand side in the laminated body 88 in FIG. 6M connected the intermediate electrode (the electrode layer 70B-1) of the first layer and the upper electrode 82. The side wall electrode 86 formed in the side wall surface in the left-hand side in the laminated body 88 in FIG. 6M connected the intermediate electrode (the electrode layer 70B-2) of the second layer and the lower electrode 32.

Generally, in the case of the laminated body having n layers of the piezoelectric films, the laminated body also has (n+1) layers of the electrodes including the lower electrode in the bottom, the intermediate electrodes interposed between the piezoelectric layers, and the upper electrode in the top surface. Odd-numbered electrodes are connected to each other by one of the side wall electrodes (the side wall electrode 84 in the example in FIG. 6M), and even-numbered electrodes are connected to each other by the other side wall electrode (the side wall electrode 86 in the example in FIG. 6M). As described above, the intermediate electrodes which are exposed to the end surfaces of the laminated body are connected to the lower electrode 32 or the upper electrode 82 through the side wall electrodes, and are thus constructed as comb-shaped electrodes.

In the present example, it was possible to layer the plurality of piezoelectric films while interposing the intermediate layers, and it was possible to form a piezoelectric device 90, which has the laminated structure as shown in FIG. 6M. The obtained piezoelectric device 90 can be used as an actuator, a sensor, an actuator with sensor, or a piezoelectric power generator. The above-described laminated body constituted of the piezoelectric films can be utilized for a variety of purposes.

Comparative Example

As a comparative example, a laminated body was prepared in accordance with the following procedures. After a TiW film of 20 nm and an Ir film of 150 nm were layered on a Si substrate, a PZT film was formed thereon at a film thickness of 2 µm at a substrate temperature (a film formation temperature) 500° C. by means of the sputtering method. After the film formation, an Ir film of 70 nm was formed directly on the PZT film at 350° C. Thus, the laminated body in the comparative example had a structure such that the Ir—O film functioning as the metal oxide film 18 was omitted from the structure (FIG. 1) of the first embodiment.

After forming the intermediate electrode of the Ir film of 70 nm, the PZT film of the second layer was formed directly on the intermediate electrode. The forming conditions were the same as the conditions of the first layer, and it was formed by targeting on 2 μm thickness.

However, taking out the sample from the film formation apparatus after the film formation step, the PZT film of the second layer was in a peeled state. It was considered that this was caused by a matter that the Ir electrode was oxidized at a time of forming the PZT film of the second layer, the Ir electrode chemically changed so as to change its volume due to a diffusion of the piezoelectric material component Pb from the PZT film of the first layer, and the PZT film peeled off from the Ir electrode (the intermediate electrode).

Making an attempt to produce an aspect that the intermediate electrode of the Ir film was changed to an intermediate electrode of a Pt film, and an aspect that the Ir electrode (or the Pt electrode) was formed after forming a Ti or TiW film as the adhesion layer; however, the peeling of the piezoelectric film of the second layer was generated in the same manner as mentioned above. Further, the same sample production was carried out by changing the film thickness of the Ir film functioning as the intermediate electrode in the comparative example to 50 nm, 120 nm, 150 nm, 200 nm and 250 nm; however, the peeling of the piezoelectric film of the second layer was generated in all the cases.

Relationship between Thickness of Intermediate Layer (Intermediate Electrode) and Peeling With regard to the laminated bodies according to the present embodiment, a relationship between the thickness of the intermediate layer and the peeling was investigated, and a result in a table shown in FIG. 7 was obtained. The "intermediate layer" in this case is a layer that is arranged between the piezoelectric bodies. The intermediate layer may function as an electrode, or may function as an insulating layer. The intermediate layers in the practical examples A to E in FIG. 7 were the layers which included the metal oxide film 18 and the metal film 20 as described in the first practical example. The intermediate layer can have a laminated structure of an $IrO_x$ film and an Ir film, for example, as described in FIG. 1, or can have a laminated structure of a film of an insulating material such as $TiO_2$ and a film of a metal such as Ir, as described in FIGS. 6A to 6M.

Here, an experiment was carried out by changing the thicknesses of the intermediate layer in the laminated structure which is exemplified in FIGS. 1 to 5. As shown in the practical examples A to D in the table in FIG. 7, if the thickness of the intermediate layer was thin (not larger than 200 nm), no peeling occurred. However, if the thickness of the intermediate layer became extremely thin, for example, in the case that it was smaller than 50 nm, there might be generated another problem such as a resistance became relatively high as the electrode, or the characteristics of blocking the diffusion from the PZT of the lower layer (the first layer) were lowered.

On the other hand, as shown in the comparative example in the table in FIG. 7, the upper piezoelectric body (the second layer) peeled off in the structure in which the thickness of the intermediate layer was not smaller than 250 nm. The upper piezoelectric body was assumed to peel off due to a stress caused by a difference in the thermal expansion coefficients between the piezoelectric body and the intermediate layer, or the like. As shown in the practical example E, a partly peeled state was observed in the case that the thickness of the intermediate layer was 200 nm, however, it can be thought that a practically allowable case may be provided. The thickness of 200 nm of the intermediate layer is hence considered as a threshold (an upper limit) of an allowable level.

On the basis of the points mentioned above, it is preferable that the thickness of the intermediate layer is not smaller than 50 nm and not larger than 200 nm, more preferably not smaller than 50 nm and smaller than 200 nm, and further preferably not smaller than 50 nm and not larger than 150 nm.

In the above descriptions, the evaluations have been carried out by using the thickness of the intermediate layer as a parameter; however, the stress is a main factor with regard to with or without the peeling. Calculating the stress of the intermediate layer having the thickness shown in the table in FIG. 7, it was about 500 MPa in the intermediate layer having the thickness of 200 nm. In other words, considering a preferable condition of the intermediate layer on the basis of a relationship between the thickness and the stress, it is preferable that a product of the stress and the thickness (stress thickness) of the intermediate layer is not larger than 100 N/m. In this case, the stress of the intermediate layer may be zero.

The product of the stress and the thickness is considered as a general index which does not depend on the material. In the light of suppression of the peeling caused by the stress caused by the difference between the thermal expansion coefficients as well as employing the structure that prevents the peeling caused by the diffusion (the structure in which the piezoelectric film is layered on the intermediate layer including the metal oxide film functioning as the diffusion block layer), it is more preferable that the product of the stress and the thickness of the intermediate layer is less than 100 N/m, and more preferably not larger than 75 N/m. Here, the smaller the product of the stress and the thickness of the intermediate layer is (the closer to zero it is the smaller the influence of the stress caused by the difference between the thermal expansion coefficients is. Accordingly, it is insignificant to define a preferable lower limit with regard to the product of the stress and the thickness of the intermediate layer.

Third Practical Example

Figure 8:
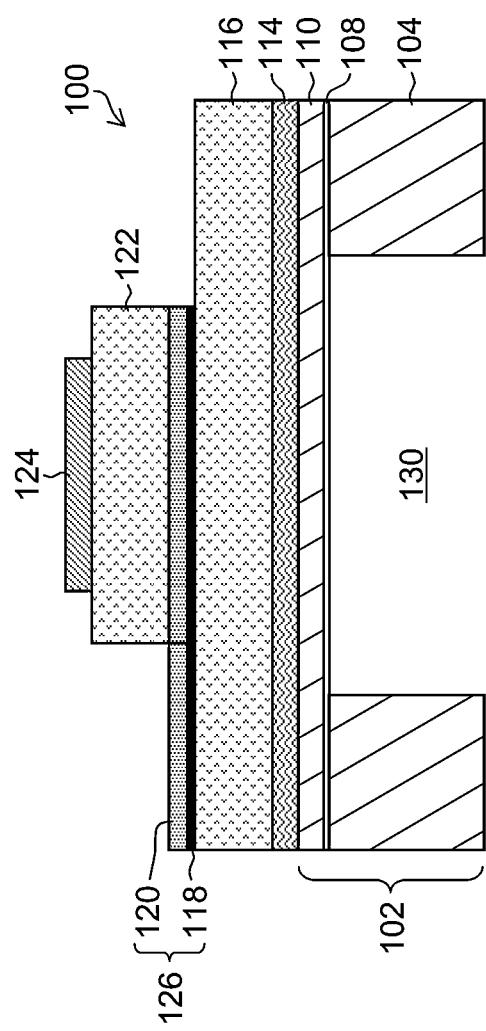
FIG. 8 is a cross sectional view showing a structure of a piezoelectric device in a third practical example of the present invention.

FIG. 8 is a view showing a structure of a piezoelectric device 100 according to a third practical example of the present invention. FIG. 8 shows a piezoelectric actuator of a diaphragm structure.

The piezoelectric device 100 is produced by layering, on an SOI substrate 102, a lower electrode 114, a first piezoelectric film 116, a metal oxide film 118, a metal film 120, a second piezoelectric film 122 and an upper electrode 124 in this order in accordance with the same process as the first practical example.

The SOI substrate 102 has a laminated structure in which an Si layer 104 functioning as a handle layer, an oxide film layer ($SiO_2$) layer 108 functioning as an insulating layer (a BOX layer), and an Si layer 110 functioning as a device layer are arranged.

The lower electrode 114 is formed by layering a TiW film and an Ir film on the Si layer 110. The piezoelectric films 116 and 122 are layered on the lower electrode 114 while intervening an intermediate electrode (an intermediate layer) 126 having the laminated structure of the metal oxide film 118 and the metal film 120. An Ir—O film is used as the metal oxide film 118 formed on the first piezoelectric film 116, and an Ir film is used as the metal film 120. The intermediate layer 126 obtained by layering the metal oxide film 118 and the metal film 120 functions as the intermediate electrode. The two piezoelectric films 116 and 122 are arranged with the intermediate electrode 126 therebetween, and the upper electrode 124 is formed on the upper surface of the piezoelectric film 122 of the second layer by layering a TiW film and an Au film.

The Si layer 110 (the device layer) is left at a thickness of 5 μm as a diaphragm by etching the wafer structure, which has been obtained by arranging the layers, from a back surface side, and removing a part of the Si layer 104. In this case, the $SiO_2$ layer 108 functions as an etching stop layer, and the diaphragm is constituted of the $SiO_2$ layer 108 and the Si layer 110 while leaving the $SiO_2$ layer 108 in FIG. 8; however, the diaphragm can be constructed by removing the $SiO_2$ layer 108.

In the case of the present example, the piezoelectric film 116 of the first layer and the piezoelectric film 122 of the second layer are composed of the same piezoelectric material, are polarized in the thickness direction, and are coincided in the polarizing direction. The polarizing direction is defined by a vector direction (a direction from negative to positive) of a dipole moment caused by a deviation of an electric charge distribution. The polarizing directions of the first piezoelectric film 116 and the second piezoelectric film 122 are upward.

When an electric field is applied to the piezoelectric body in the same direction as the polarizing direction of the piezoelectric body, the piezoelectric body is going to contract within a surface of the diaphragm on the basis of the piezoelectric transverse effect ($d_{31}$ mode). When the piezoelectric film formed on the diaphragm contracts within the surface of the diaphragm, the diaphragm constrains the deformation of the piezoelectric film. Therefore, the diaphragm deforms to deflect (bend) in the thickness direction.

The structure as shown in FIG. 8 is applied, for example, to an inkjet head. A recessed space 130 which is formed by the etching corresponds to an ink chamber (a pressure chamber).

Figure 9:
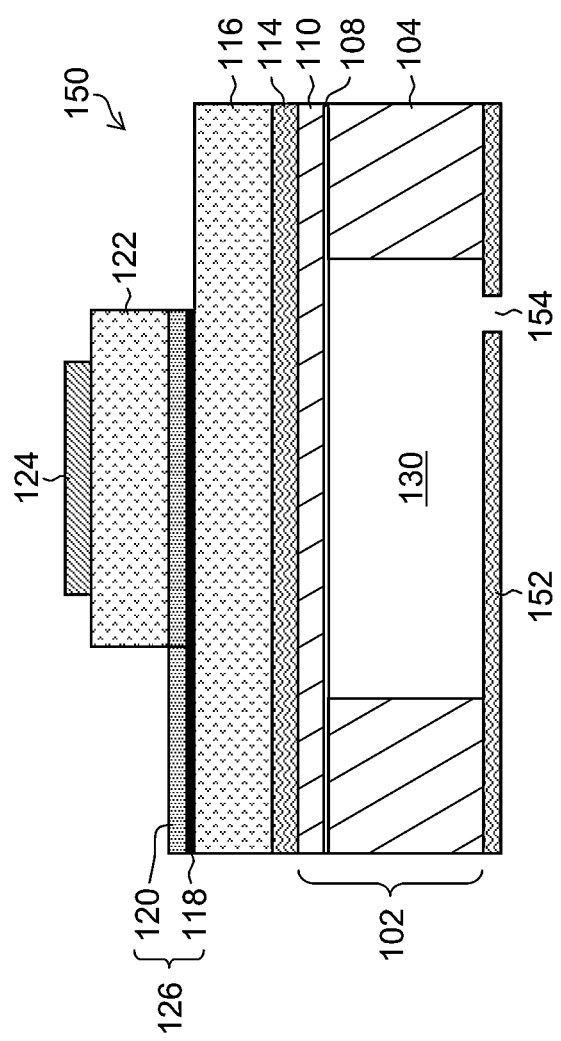
FIG. 9 is a view of a structure of an inkjet head to which the piezoelectric device in the third practical example is applied.

An example the inkjet head is shown in FIG. 9. In FIG. 9, the same or similar elements as those in the structure shown in FIG. 8 are denoted with the same reference numerals and a description thereof is omitted. An inkjet head 150 shown in FIG. 9 is structured such that a nozzle plate 152 is joined to a bottom surface of the Si layer 104 of the laminated structure described in FIG. 8. A nozzle aperture 154 functioning as an ejection port of an ink (a liquid) is formed in the nozzle plate 152. The ink is filled in the space (the pressure chamber) 130, the diaphragm (the Si layer 110) is deformed to deflect by means of the piezoelectric drive, and the volume of the pressure chamber 130 changes, whereby the pressure is changed and a droplet of the ink is ejected from the nozzle aperture 154.

Although not shown in FIG. 9, an ink supply flow path (a common supply path, an individual supply path, and the like) for supplying the ink to the pressure chamber 130 is formed in the Si layer 104. Further, in FIG. 9, there is shown the example in which the nozzle plate 152 is joined directly to the lower surface of the Si layer 104; however, a flow path plate in which the other flow path structure is formed can be arranged between the Si layer 104 and the nozzle plate 152.

Example of Drive Control

Figures 10, 11, 12:
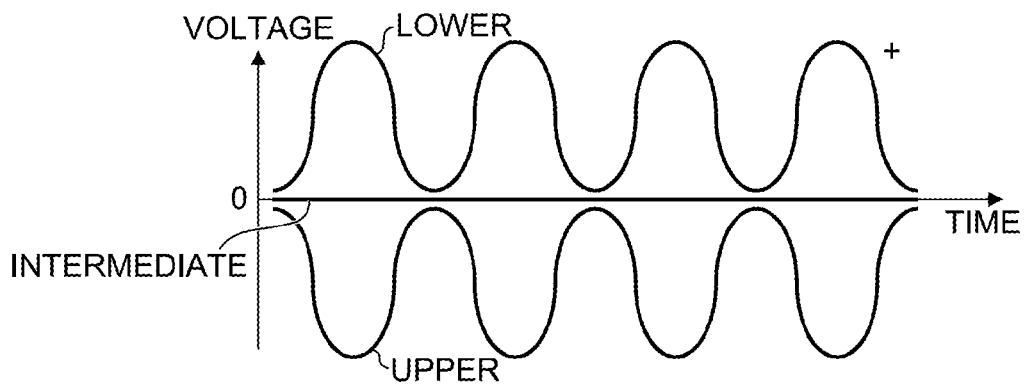
FIG. 10 is a table exemplifying a relationship between directions and magnitudes of voltages applied to the piezoelectric device in the third practical example.
FIG. 11 is a graph showing examples of waves of voltages applied to electrodes of the piezoelectric device in the third practical example.
FIG. 12 is a table showing drive examples of the piezoelectric device and results of measurements of displacing amounts of the piezoelectric device in the third practical example.

In the piezoelectric device 100 in accordance with the third practical example shown in FIG. 8, since the polarizing direction of the obtained piezoelectric films 116 and 122 is upward in FIG. 8, it is preferable to employ a drive method (a voltage application method) having the relationship between a direction and a magnitude of an applied voltage, for example, as shown in FIG. 10.

The voltage application method 1 in FIG. 10 is an aspect that the intermediate electrode 126 is grounded, a positive voltage ($+V_1$) is applied to the lower electrode 114, and a negative voltage ($-V_2$) is applied to the upper electrode 124. In this case, absolute values of the positive voltage ($+V_1$) applied to the lower electrode and the negative voltage ($-V_2$) applied to the upper electrode are set to be equal to each other and $|+V_1|=|-V_2|=20$ V; however, the specific values of the applied voltages are not limited to this example. Further, $|+V_1|$ and $|-V_2|$ can not be necessarily equal to each other.

The voltage application method 2 in FIG. 10 is an aspect that the lower electrode 114 is grounded, a negative voltage ($-V_3$) is applied to the intermediate electrode 126, and a negative voltage ($-V_4$) having a greater absolute value than the negative voltage applied to the intermediate electrode 126 is applied to the upper electrode 124. Here, the case of $-V_3=-20$ V and $-V_4=-40$ V was exemplified; however, the specific values of the applied voltages are not limited to this example.

The voltage application method 3 in FIG. 10 is an aspect that the upper electrode 124 is grounded, a positive voltage ($+V_5$) is applied to the intermediate electrode 126, and a positive voltage ($+V_6$) having a greater absolute value than the positive voltage applied to the intermediate electrode 126 is applied to the lower electrode 114. Here, the case of $+V_5=+20$ V and $+V_6=+40$ V is exemplified; however, the specific values of the applied voltages are not limited to this example.

In any of the voltage application methods 1 to 3, the relative relationship of Vtop<Vmid<Vbot is satisfied, where Vtop is the electric potential of the upper electrode, Vmid is the electric potential of the intermediate electrode, and Vbot is the electric potential of the lower electrode.

FIG. 11 shows the electric potentials of the electrodes in the case of employing the voltage application method 1 in the table in FIG. 10 as an example of the voltage application.

Further, by carrying out an experiment under a voltage application method similar to the method 1 in the table in FIG. 10, the displacement on the diaphragm of the upper electrode was measured. The driving states and the results thereof are shown in a table in FIG. 12. In this case, the amount of displacement measured here corresponds to an ejection amount in the case that the inkjet head is assumed. In other words, the greater the amount of displacement of the actuator is, the greater the ejection amount is.

As shown in FIG. 12, the amount of displacement was larger in the case that both the first piezoelectric layer and the second piezoelectric layer were simultaneously driven in comparison with the case that one of the two layers was independently driven (as the single layer). The amount of displacement obtained by driving one of the two layers as the single layer was 55.5 nm or 56.5 nm, and the mount of displacement obtained by driving both the two layers was 95.5 nm. Accordingly, it was known that the displacement having the magnitude about 1.7 times was obtained in the case where both the two layers were driven in comparison with the case where one of the two layers was driven as the single layer. When the applied voltage is changed, the amount of displacement changes accordingly, and in any case, the amount of displacement of driving simultaneously the two layers comes to about twice (around 1.7 times) in comparison with the amount of displacement at diving one of the two layers as the single layer.

In the structure shown in FIG. 8, checking the amount of displacement of the actuator (the amount of deflection deformation of the diaphragm 110) by setting the intermediate electrode 126 to the ground potential, applying +20 V to the lower electrode 114 and applying −20 V to the upper electrode 124, a good displacement was obtained, and about twice displacement was obtained in comparison with the actuator constituted of the single layer of PZT film. A sufficient performance can be obtained as the inkjet head.

Fourth Practical Example

Figure 13:
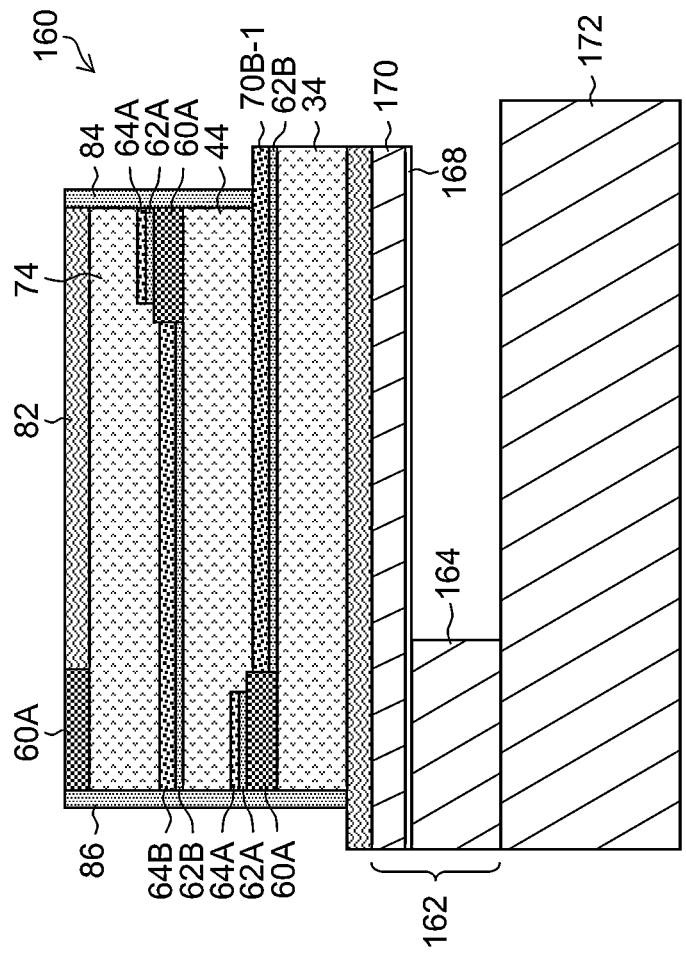
FIG. 13 is a cross sectional view showing a structure of a piezoelectric device in a fourth practical example of the present invention.

Next, a fourth practical example of the present invention is described. FIG. 13 is a view of a structure of a piezoelectric device according to the fourth practical example. In FIG. 13, the same or similar elements as those in the structure shown in FIGS. 6A to 6M are denoted with the same reference numerals and a description thereof is omitted.

The piezoelectric device 160 shown in FIG. 13 is of a cantilever structure produced by forming a laminated structure constituted of a plurality of piezoelectric films described in the second practical example on an SOI substrate 162.

The SOI substrate 162 has a laminated structure in which an Si layer 164 functioning as a handle layer, an oxide film layer ($SiO_2$) layer 168, and an Si layer 170 functioning as a device layer are arranged. The SOI substrate 162 is hereby used instead of the Si substrate 30 in the second practical example described with reference to FIGS. 6A to 6M, and the piezoelectric films 34, 44 and 74 are layered on the Si layer 164 by means of the same process as the second practical example. After obtaining the same laminated structure as FIG. 6M, a part of the Si layer 164 is removed by etching a back side of the substrate 162, thereby leaving the Si layer 170 (the device layer) corresponding to the diaphragm. Although the $SiO_2$ layer 168 is left in FIG. 13, the $SiO_2$ layer 168 can be removed.

Another plate member (for example, a silicon substrate) 172 is joined to a bottom surface of the Si layer 164 which is left by the etching, and the device 160 having the structure shown in FIG. 13 is obtained.

In the obtained device 160, the piezoelectric films 34, 44 and 74 are deformed by a vibration of the cantilever, and a voltage is generated between the upper and lower electrodes of each of the piezoelectric films 34, 44 and 74. The voltages can be taken out to the external so as to be utilized as an electric power. In other words, the device 160 is used as a piezoelectric film power generator having a laminated structure which can be utilized as a power generating device. It is possible to obtain a greater generated voltage by increasing the number of lamination of the piezoelectric films.

Operation

As described with reference to FIGS. 1 to 13, in accordance with the embodiments of the present invention, since it is possible to use the piezoelectric films in the laminated structure, it is possible to achieve an effective performance improvement of the piezoelectric device using the piezoelectric film material.

For example, with regard to the piezoelectric device which is utilized as the piezoelectric actuator, a great displacement can be obtained by applying a drive voltage having a comparatively low voltage. Further, a burden of a control circuit including a drive circuit is lightened by a reduction of the drive voltage, and it is possible to achieve low cost, power saving, improvement of durability, and the like.

Further, with regard to the piezoelectric device which is utilized as the power generating device, it is possible to increase the voltage of the power generation by using the laminated structure of the piezoelectric films, and it is possible to achieve a desired power generating performance which is suitable for a practical use.

Furthermore, with regard to the piezoelectric device which is utilized as the sensor, a great voltage signal can be obtained by the deformation of the piezoelectric films, and it is possible to improve a sensitivity of the sensor.

Other Applied Example 1

For example, in an angle sensor, there are used a driving actuator (utilizing the inverted piezoelectric effect) and a piezoelectric body for a sensor (utilizing the piezoelectric effect), and the general angle sensor in the related art is structured such that these two elements are installed on the same plane.

On the contrary, according to the laminated body to which the present invention is applied, since the piezoelectric film of the first layer can be utilized as the actuator and the piezoelectric film of the second layer can be utilized as the sensor (or vice versa), then the angle sensor can be realized by a smaller area in comparison with the structure in the related art.

The sensor and other devices which can be constructed in the smaller area as mentioned above can be mounted to a compact electronic device or the like such as a mobile phone or the like. Further, since an available number of the devices having the smaller areas is increased within a wafer, a low cost can be achieved.

Other Applied Example 2

In a piezoelectric actuator having the laminated structure of the plurality of piezoelectric films, the control of the actuator can be allowed a lot of latitude by controlling the piezoelectric body in each of the layers at a high level. For example, by applying the piezoelectric actuator of the laminated structure mentioned above to the inkjet head, and carrying out a drive control such as changing the number of the driven piezoelectric layers in the plurality of piezoelectric layers, it is possible to change a size of an ejected droplet, change an ejection speed, or carry out a meniscus control of swinging the meniscus to such a degree that causes no ejection.

It should be understood that there is no intention to limit the invention to the specific forms disclosed, but on the contrary, the invention is to cover all modifications, alternate constructions and equivalents falling within the spirit and scope of the invention as expressed in the appended claims.

What is claimed is:
1. A piezoelectric device, comprising:
a substrate;
a first electrode which is layered over the substrate;
a first piezoelectric film which is layered over the first electrode;
an intermediate layer including a metal oxide film and a metal film, wherein the metal oxide film is layered over the first piezoelectric film, and the metal film is layered over the metal oxide film;
a second piezoelectric film which is layered over the metal film; and
a second electrode which is layered over the second piezoelectric film, wherein:
a thickness of the intermediate layer is not smaller than 50 nm and smaller than 200 nm; and
a product of a stress in the intermediate layer and the thickness of the intermediate layer is less than 100 N/m.

2. The piezoelectric device as defined in claim 1, wherein the thickness of the intermediate layer is not larger than 150 nm.

3. The piezoelectric device as defined in claim 1, wherein the product of the stress in the intermediate layer and the thickness of the intermediate layer is not larger than 75 N/m.

4. The piezoelectric device as defined in claim 1, wherein each of the first piezoelectric film and the second piezoelectric film is formed by means of a vapor phase epitaxy method.

5. The piezoelectric device as defined in claim 4, wherein the vapor phase epitaxy method is a sputtering method of crystallizing by implementing a heat film formation.

6. The piezoelectric device as defined in claim 1, wherein the metal oxide film includes an oxide of a metal of platinum group.

7. The piezoelectric device as defined in claim 1, wherein the metal oxide film includes an oxide of a metal of titanium group.

8. The piezoelectric device as defined in claim 1, wherein the metal film includes a metal of platinum group.

9. The piezoelectric device as defined in claim 1, wherein each of the first piezoelectric film and the second piezoelectric film is composed of a perovskite type oxide.

10. The piezoelectric device as defined in claim 9, wherein in each of the first piezoelectric film and the second piezoelectric film, the perovskite type oxide has a crystal preferred orientation of (100) or (001).

11. A manufacturing method of a piezoelectric device, the method comprising:
a first electrode formation step of layering a first electrode over a substrate;
a first piezoelectric film formation step of layering a first piezoelectric film over the first electrode;
an intermediate layer formation step of forming an intermediate layer including a metal oxide film and a metal film, wherein the intermediate layer formation step includes a metal oxide film formation step of layering the metal oxide film over the first piezoelectric film, and a metal film formation step of layering the metal film over the metal oxide film;
a second piezoelectric film formation step of layering a second piezoelectric film over the metal film; and
a second electrode formation step of layering a second electrode over the second piezoelectric film, wherein:
a thickness of the intermediate layer is not smaller than 50 nm and smaller than 200 nm; and
a product of a stress in the intermediate layer and the thickness of the intermediate layer is less than 100 N/m.

12. The method as defined claim 11, wherein each of the first piezoelectric film formation step and the second piezoelectric film formation step includes a vapor phase epitaxy method.

13. The method as defined in claim 12, wherein the vapor phase epitaxy method is a sputtering method of crystallizing by implementing a heat film formation.

14. The method as defined in claim 11, wherein the thickness of the intermediate layer is not larger than 150 nm.

15. The method as defined in claim 11, wherein the product of the stress in the intermediate layer and the thickness of the intermediate layer is not larger than 75 N/m.

* * * * *